United States Patent [19]
Parker et al.

[11] Patent Number: 5,510,704
[45] Date of Patent: Apr. 23, 1996

[54] POWERED TESTING OF MIXED CONVENTIONAL/BOUNDARY-SCAN LOGIC

[75] Inventors: Kenneth P. Parker; Kenneth E. Posse, both of Fort Collins, Colo.

[73] Assignee: Hewlett-Packard Company, Palo Alto, Calif.

[21] Appl. No.: 444,473

[22] Filed: May 19, 1995

Related U.S. Application Data

[60] Division of Ser. No. 156,204, Nov. 22, 1993, Pat. No. 5,448,166, which is a continuation-in-part of Ser. No. 88,279, Jul. 6, 1993, Pat. No. 5,387,862, which is a continuation of Ser. No. 817,014, Jan. 3, 1992, Pat. No. 5,260,649.

[51] Int. Cl.[6] ................................................. G01R 31/28
[52] U.S. Cl. .................................... 324/158.1; 371/22.3
[58] Field of Search ............................ 324/158.1, 765, 324/73.1; 371/22.1, 22.3

[56] References Cited

U.S. PATENT DOCUMENTS

| | | | |
|---|---|---|---|
| 4,827,208 | 5/1989 | Oliver et al. | 324/158.1 |
| 5,042,034 | 8/1991 | Correale, Jr. et al. | 371/22.3 |
| 5,172,377 | 12/1992 | Robinson et al. | 371/22.3 |
| 5,283,518 | 2/1994 | King et al. | 324/158.1 |
| 5,428,623 | 6/1995 | Rahman et al. | 371/22.3 |

*Primary Examiner*—Ernest F. Karlsen

[57] ABSTRACT

A method for testing a circuit board having both boundary-scan and non-boundary-scan devices is provided. The test method distinguishes boundary-scan nodes from non-boundary-scan nodes and uses cartesian coordinates (X,Y) of every pin of every device on the circuit board to determine a number of sets of non-boundary-scan nodes that are within a predetermined distance "R" from a device pin coupled to a boundary-scan node. The number of sets of non-boundary-scan nodes are grouped into "independent" groups which can be tested in parallel. A test cycle is performed by testing independent non-boundary-scan nodes in parallel by forcing drivers in the boundary-scan devices to a first logic state, and forcing each of the non-boundary-scan nodes to another logic state for a brief interval. Receivers on the boundary-scan devices capture a response vector during the brief interval, which is scanned out of the circuit board for evaluation. The response vector reflects which of the nodes has failed, and cartesian coordinate data giving the precise location of any faulty node(s) is returned to user.

10 Claims, 7 Drawing Sheets

POWERED TESTING OF MIXED CONVENTIONAL/BOUNDARY-SCAN LOGIC

BACKGROUND OF THE INVENTION

1. Cross Reference to Related Applications

This is a divisional of application Ser. No.08/156.204 filed on Nov. 22, 1993, now U.S. Pat. No. 5,448,166 which is a continuation-in-part of application Ser. No. 08/088,279, filed Jul. 6, 1993, now U.S. Pat. No. 5,387,862, which is a continuation of application Ser. No. 07/817,014, filed Jan. 3, 1992, now issued as U.S. Pat. No. 5,260,649.

2. Field of the Invention

The invention in general relates to apparatus and methods of testing electrical circuits and more particularly to apparatus and methods of testing circuits which include some circuit elements that include boundary-scan logic and some circuit elements that do not include boundary-scan logic.

3. Statement of the Problem

The testing of electrical circuits is nearly as old as electrical circuits themselves. In simple circuits this is done by applying small voltages to all the circuit nodes to test for shorts or open circuits. The term "node" in this specification means any equipotential circuit element; an example is a connecting wire or trace between two electrical components. Device pins which are interconnected by the wires or traces are also a part of nodes.

As circuits have become more complex it has become ever more important and more difficult to thoroughly test circuits. A common way of doing this is to design a testing apparatus and method as part of the development program for every manufactured circuit, such as a circuit board for a TV. Generally a program is developed which is programmed into a complex testing machine which includes hundreds or even thousands of resources, such as voltage drivers and receivers, which are alternately connected to the nodes of the circuit via relays and contact nails in a programmed sequence to test the circuit.

In complex circuits not every combination of nodes can be tested, since this is too time consuming. So the test designer must develop some way to make sure that the nodes most likely to fail in the particular circuit are tested. This has become a very complex science utilizing higher mathematics and computers. See for example U.S. Pat. No. 4,601,032 issued to Gordon D. Robinson which devises and applies a complex waveform of test vectors (a set of digital voltages applied to a set of nodes) to the circuit elements to test the circuit, and U.S. Pat. No. 5,027,353 issued to Najmi T. Jarwala et al., which uses a weighted mathematical system to determine a compact set of test vectors to test the circuit.

One problem with such tests is that the vectors or waves, which are pulses of voltage applied to the system, can damage the system if there is a fault in the system and the voltages are applied for too long of a period. This can often happen because the systems are so complex that it takes a long time to run such tests.

Another problem is that generally the better such tests are at finding that there is a circuit fault, the less likely it is that they are able to locate precisely where the circuit fault is. Since complex circuit boards are expensive, it is essential to know where the fault is so that it can be repaired. Another problem is that in modern electronic circuits with surface mount, fine geometries, and double-sided boards, not all nodes will be accessible, and thus cannot be tested by such methods.

One solution to the problem of potentially damaging devices during powered tests is found in U.S. Pat. No. 4,588,945 issued to William A. Groves et al., which describes a method of testing which provides a time limit for applying test signals and a cool down time in between test signals, the length of which time limit and cool down time is determined from the characteristics of the devices tested.

One solution to the problem of precisely locating system faults when not all nodes are accessible is called boundary-scan. Boundary-scan is a test system in which each component of a circuit, such as a chip, is constructed with a set of shift registers placed between each device pin and with a specific internal logic system. This system has been defined in an IEEE standard No. 1149.1–1990. The boundary-scan standard allows the entire circuit to be accurately tested by scanning only the boundary pins of the circuit. For a complete description of boundary-scan see *HP Boundary-Scan Tutorial and BSDL Reference Guide*, published by Hewlett Packard Company, Manual Part No. E1017-90001. See also U.S. Pat. No. 4,872,169 issued to Lee D. Whetsel, Jr., U.S. Pat. No. 4,879,717 issued to Wilhelm A. Sauerwald et al., U.S. Pat. No. 4,967,142 issued to Wilhelm A. Sauerwald et al., European patent application number 89308562.1 of Lee D. Whetsel, Jr., and European patent application No. 90305582.0 of Najmi T. Jarwala et al. which disclose various details of the implementation of boundary-scan.

The boundary-scan system described in the above references produces excellent results in circuits which are composed wholly of boundary-scan circuit elements. However, in the real world there are very few such systems. Usually an electronic circuit is composed of elements made by a wide variety of manufacturers, many of which do not use the boundary-scan standard. Also, almost all circuits include non-digital devices such as analog integrated circuits and discrete devices such as transistors, diodes, resistors and the like. There is a need for an apparatus and testing method for testing such circuits.

The testing of mixed circuits, i.e. circuits which contain both conventional and boundary-scan circuit elements by boundary-scan techniques presents two significant problems: 1) the boundary-scan test is a powered test-this means that in the presence of potentially damaging shorts, the circuit is powered and can be damaged; and 2) the presence of non-boundary-scan elements compromises the boundary-scan test in that a short between a non-boundary-scan element and a boundary-scan element will often cause the boundary-scan node to have the wrong logic value, and the results are not likely to be repeatable because the conventional logic is on and is not predictable. See *Interconnect Testing of Boards with Partial Boundary-scan*, Gordon D. Robinson & John G. Deshayes, IEEE 1990 International Test Conference Proceedings, CH29100-6/000/0572, Paper 27.3, pages 572–581.

The above paper discloses a method of solving the problem by a four part test: first, a conventional shorts test is done between all places to which the tester has access; second, the boundary circuit test circuitry and the path segments between components are tested to see they are working properly; third, a test for shorts between non-boundary-scan nodes with tester access and the boundary-scan nodes without access are tested; Finally, a test for opens and shorts on the pure boundary-scan nodes.

The third test can have two forms. The simplest tests one node at a time; it forces a high on the node, does a boundary-scan test, then forces a low on the node and performs another boundary-scan test. If there is a short, one of these tests will likely produce a wrong result on the boundary-scan test. The other form of the third test tests several nodes at once and each node is given a unique identifier signal. A short is declared when one of the boundary-scan test nodes sees one of the identifiers. The problem with this test is that using the simplest form of the third test can take unacceptably long and use a large number of resources in a complex circuit and using the second form of the third test gives ambiguous results since the identifier can propagate to the boundary-scan node through nodes other than the driven node. This test also takes a long time since the number of sets to be tested can be very large.

Another system for testing mixed conventional and boundary-scan nodes is disclosed in U.S. Pat. No. 4,963,824 issued to Edward P. Heleb et al. The method disclosed replaces each circuit board component in turn with a testing device. The method also discloses isolating non-boundary-scan components by applying special connector cards with boundary-scan capabilities to the connectors around the component. This method is impractical since removing the devices and replacing them not only is unwieldy and time consuming, but destroys the very basis of the test: since the component must be replaced, and since the replacement can cause shorts or opens, the board should be retested afterwards. Attaching special cards to isolate the non-boundary-scan components not only is time consuming, but assumes that the cards can be connected which is often not the case in complex, surface mounted and double sided boards.

A need exists for a test apparatus and method for mixed conventional and boundary-scan circuits that tests more than one node at a time, reduces the set of nodes tested to a manageable number, can unambiguously detect circuit faults, and does not require the physical alteration of the circuit.

4. Solution to the problem

The invention provides apparatus and methods for testing circuits having boundary-scan and non-boundary-scan components that reduces the number of nodes to be simultaneously tested. The invention provides apparatus and methods for testing that determines the precise location of the faulty node and returns that information to the user. The invention also provides methods for testing that prevents damage to the circuit due to power being applied for too long a time. The invention provides methods for testing that provides a short test time per node and correspondingly shorter test time for the entire circuit board.

SUMMARY OF THE INVENTION

The present invention involves a method for testing a circuit board having both boundary-scan and non-boundary-scan devices. The test method distinguishes boundary-scan nodes which are coupled to both a boundary-scan receiver and a boundary-scan driver from non-boundary-scan nodes. The method uses adjacency or position data of every pin of every device on the circuit board to determine a number of sets of non-boundary-scan nodes that are within a predetermined distance "R" from a device pin coupled to a boundary-scan node. The method determines which of the number of non-boundary-scan nodes in each set T are "independent" such that each boundary-scan node on the circuit board is within the predetermined distance of only one non-boundary-scan node in any independent group.

The circuit board is tested in a number of test cycles. Each test cycle is performed by selecting all of the non-boundary-scan nodes in each independent set and testing the selected non-boundary-scan nodes in parallel by forcing drivers in the boundary-scan devices to a first voltage, and briefly forcing each of the non-boundary-scan nodes to another voltage. Receivers on the boundary-scan devices capture a response vector, which is scanned out of the circuit board for evaluation. The boundary-scan nodes are then driven to the second voltage and the non-boundary-scan nodes are driven to the first voltage followed by another capture of the response vector. The test cycle is completed by selecting and testing each independent set of non-boundary-scan nodes until all of the non-boundary-scan nodes are tested.

Because independent non-boundary-scan nodes are selected and tested in parallel, the response vector will reflect which of the nodes has failed, and the position data, preferably in the form of cartesian coordinate data, giving the precise location of any faulty node(s) is returned to user. Because the non-boundary-scan nodes are only briefly driven immediately before the response vector is captured, risk of circuit damage is minimal and test time is improved. A number of test cycles are repeated until all independent groups are tested.

DESCRIPTION OF THE PREFERRED EMBODIMENT

1. Overview.

Figure 1:
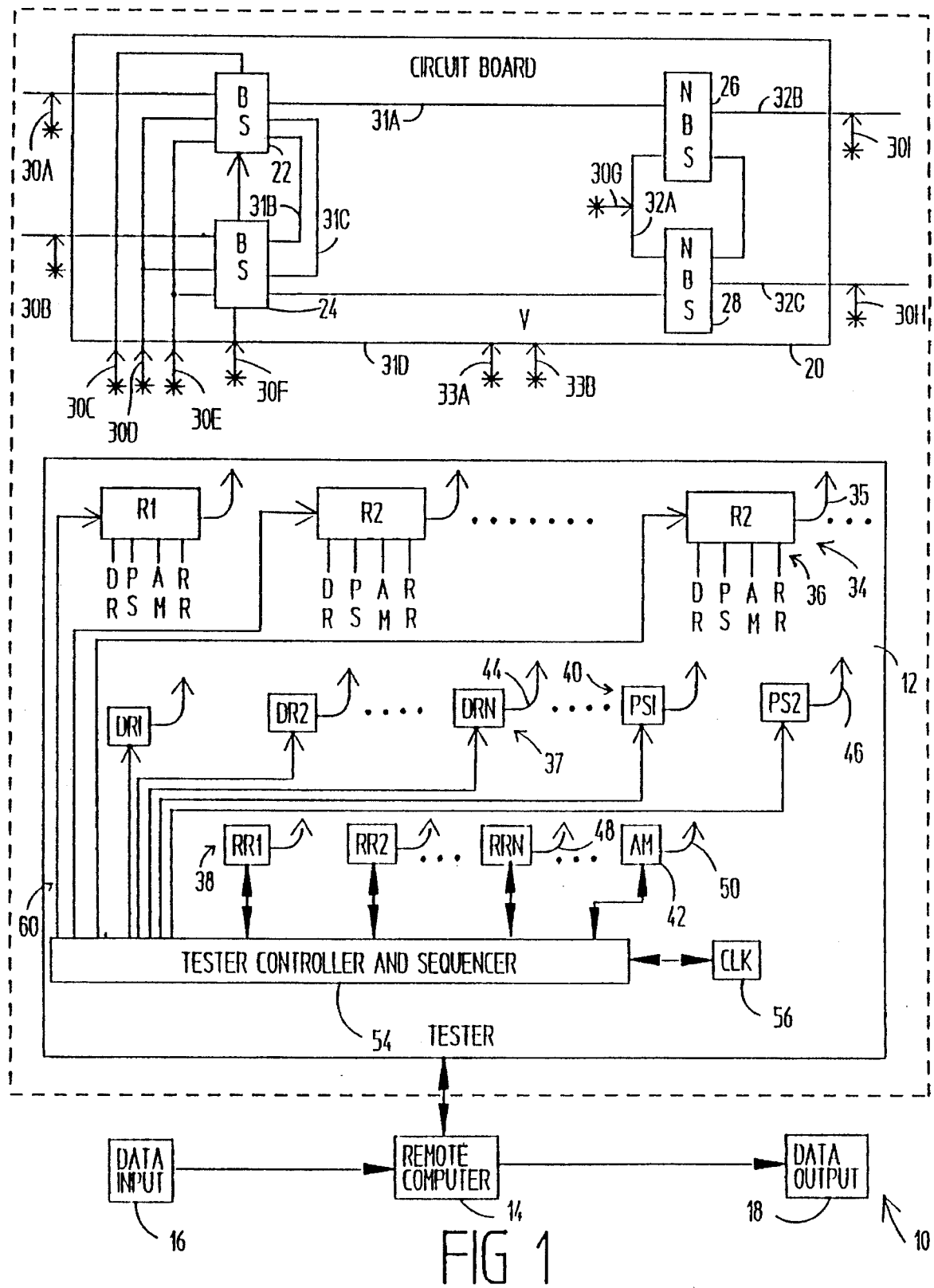
FIG. 1 is a block diagram of the preferred embodiment of apparatus for testing circuits according to the invention.

Turning now to FIG. 1, a block diagrammatic view of a preferred embodiment of a circuit testing system 10 according to the invention is shown. The system 10 includes a tester 12 and a remote computer 14 having a data input 16, such as a LAN, telephone, disc or tape drive, keyboard, etc., and a data output 18, such as a display, printer, disk or tape drive, etc. An exemplary circuit board 20 to be tested includes two boundary-scan components 22 and 24 and two non-boundary-scan components 26 and 28. The circuit has six nails 30A through 30F which provide access to six "boundary" or "external" nodes of the boundary-scan components 22 and 24 and three nails 30G through 30I which provide access to three nodes of the non-boundary-scan components 26 and 28. There are also one or more nails 33A and 33B which provide the circuit power supply.

The "internal" boundary-scan nodes 31A through 31D have no access via nails. In an actual circuit to be tested, there may be hundreds of components and hundreds or even thousands of nodes and nails. The tester 12 has a multiplicity of relays 34, each of which has a contact means, such as 35, for electrically contacting the nails 30A through 30F and 31A through 31C. Each relay also has a plurality of input/output lines 36. The tester 12 also has a multiplicity of drivers 37 and receivers 38, a plurality of power sources 40, and at least one analog module 42, each of which has a means, such as 44, 46, 48, and 50 for connecting to the input/output lines 36 of the relays 34. There may be hundreds of relays 34, drivers 37, and receivers 38 and tens of different power sources in a typical tester.

The tester 12 also includes a controller and sequencer 54 and a clock 56 which communicates with the controller-sequencer 54. In general, the controller-sequencer 54 communicates with each of the relays 34, drivers 37, receivers 38, power sources 46, and analog module 42 via cables 60 and controls the system to apply a programmed sequence of signals from power sources 40, drivers 37, and analog module 42 to predetermined ones of the nails 30A through 30I, and the receivers 38 receive, via relays 34, and pass on to the controller-sequencer signals from other predetermined ones of the nails 30A through 30I.

More particularly, according to the invention, information regarding the X-Y locations of the boundary-scan nodes without nails, i.e. nodes 31A through 31D, and the non-boundary-scan nodes with nails, i.e. nodes 32A through 32C, is fed into remote computer 14 via data input terminal 16. From this information, sets T of non-boundary-scan nodes 32A through 32C within a radius R of each boundary-scan node 31A through 31D are defined. For example, for the simple circuit shown in FIG. 1, the set T corresponding to the node 31A may be the single node 32A. Then, via input terminal 16 and computer 14, the controller-sequencer 54 of tester 12 is programmed to perform a test.

Under a test program according to the invention, one of the drivers 37 would be assigned to each nail 30A through 30H and one of the receivers 38 is assigned to each nail 30A through 30F. First a conventional unpowered shorts test is run on the accessible nodes, i.e. the nodes connected to the nails 30A through 30I. If the circuit 20 passes this test, then the circuit 20 is powered up by application of power to the circuit power inputs 33A and 33B via power sources 40 and relays 34. A "mixed circuit" test is then performed in accordance with the method of the present invention, which is described in greater detail hereinafter.

At the time of setting up the test with data input terminal 16 and computer 16, a time limit may be defined for each non-boundary-scan node, which time limit corresponds to the length of time the circuit can tolerate a short between that node and a boundary-scan node. The boundary-scan nodes to be tested are then ordered by the length of the time limits associated with the non-boundary-scan nodes in their associated sets T, with the one with the shortest time limit being first.

As soon as possible after power up of the circuit 20, clock 56 is reset. After each node is tested, the time limit of the nodes yet to be tested are compared to the clock time, and if the clock time equals or exceeds any of these limits, the test is temporarily suspended. The test may be restarted after the circuit has had a chance to cool down. After completion of this test of the mixed nodes, a standard boundary-scan interconnect test may be run.

2. Detailed Description of Mixed Circuit testing a. Terminology

A "boundary-scan node" or "BS node" as used herein means any node which is coupled to both a boundary-scan receiver and a boundary-scan driver. For example, all of the device pins of device 201 have both a driver and receiver, as suggested by the label "D/R" placed inside each boundary-scan cell 214. Thus, these device pins will always be boundary-scan nodes regardless of what is connected to them. Devices 202 and 203, however, have cells 212 which are only receivers, as suggested by the letter "R" placed in each receiver cell 212 in FIG. 2. Devices 202 and 203 also have a number of cells 213 which are only drivers, as indicated by the letter "D" placed in each driver cell 213 in FIG. 2.

A boundary-scan node can be formed by coupling a receiver 212 to a driver 213 as shown by boundary-scan node 223 coupling device pins 242 and 243 of chips 202 and 203. The receiver and driver may be on the same chip, as shown by node 222. Also, a boundary-scan node may include device pins or terminals of non-boundary-scan devices, such as boundary-scan node 221 and 222.

Figure 2:
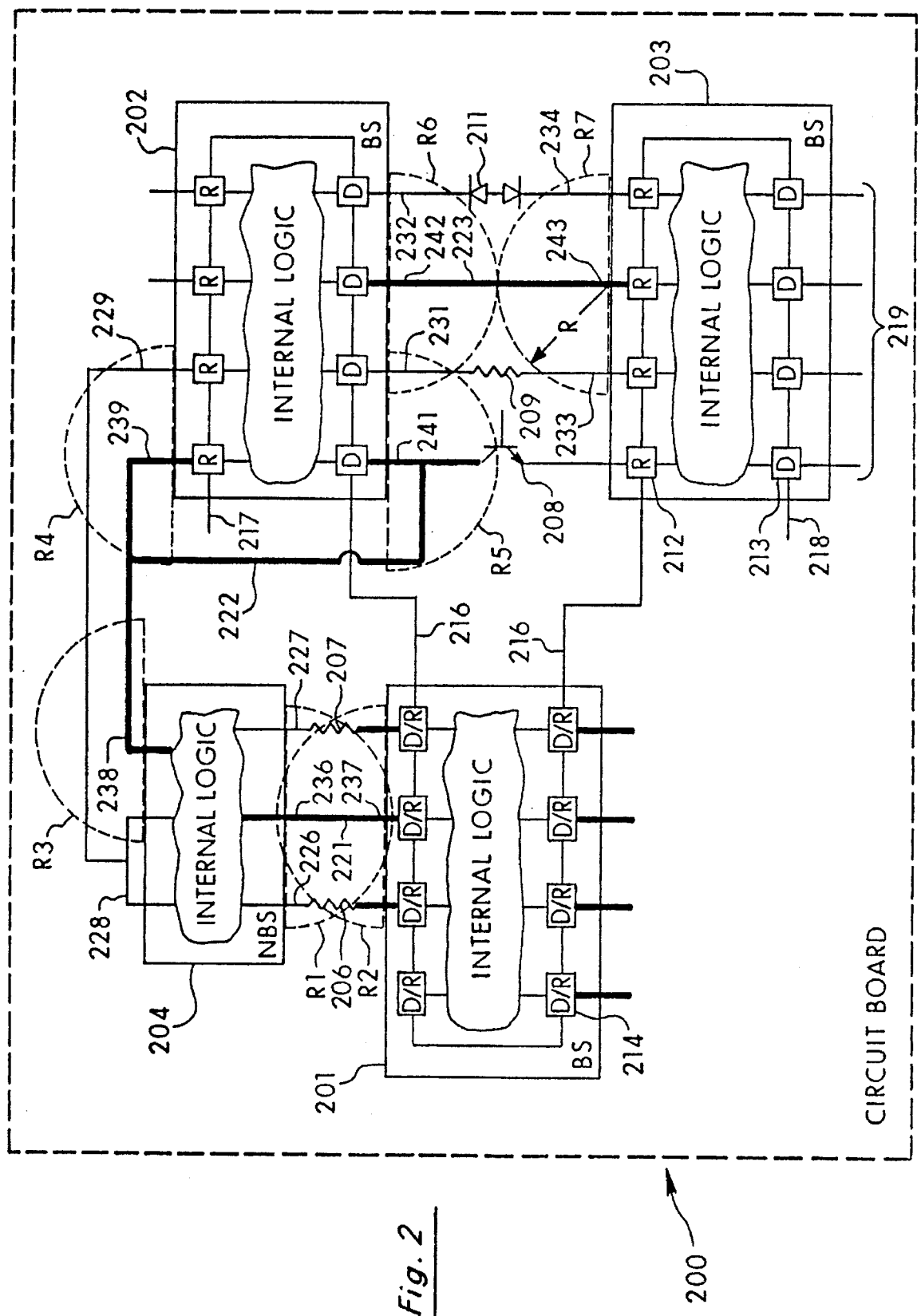
FIG. 2 shows in simplified schematic form a sample of a circuit with an exemplary radius R superimposed for testing accordance with the present invention.

A node coupled to only a receiver cell 212 or a driver cell 213, but not both, is not a boundary-scan node by conventional terminology. Such nodes are referred to herein as "non-boundary-scan nodes" or "NBS nodes". Examples of non-boundary-scan nodes in FIG. 2 are device pins 226 and 227 of non-boundary-scan device 204 which are neither coupled to a receiver nor a driver. Device pin 228 of device 204, and device pins 208, 233, and 234 of device 203 are also non-boundary-scan nodes because they are coupled only to a receiver cell. Likewise, device pins 231 and 232 are non-boundary-scan nodes because they are not coupled to a receiver cell.

It is important to understand the above terminology for a thorough understanding of the present invention. A boundary-scan node may include device pins and terminals of non-boundary-scan devices. Non-boundary-scan devices are not only logic devices such as chip 204, but may also be analog or linear integrated circuits, as well as discrete devices such as resistors 206, 207, and 209, transistor 208, diodes 211.

b. Determining Sets of Non-Boundary-Scan Nodes

Turning now to a more detailed description of the invention, FIG. 2 shows an exemplary circuit board 200 which is useful in describing how a set T of non-boundary-scan nodes is determined. Circuit board 200 includes three boundary-scan devices 201, 202, and 203, and non-boundary-scan-devices 204, 206, 207, 208, 209, and 211.

Boundary-scan devices 201, 202, and 203 contain boundary-scan circuitry which conforms to the IEEE 1149 family of standards.

Each boundary-scan node (indicated by bold lines in FIG. 2) is sequentially chosen. Starting with boundary-scan node 221, for example, the locations of all of the device pins which are connected to node 221 are determined. In this case, pin 237 of boundary-scan chip 201 and pin 236 of non-boundary-scan chip 204 are connected to node 221. A set $T_1$ of non-boundary-scan nodes that are within a radius "R" (indicated by the dashed semi-circles R1 and R2 in FIG. 2) of each of device pins 236 and 237 is determined as described in detail hereinafter.

To determine which non-boundary-scan nodes are adjacent to the selected boundary-scan node, a "shorting radius" R, with length shown by the arrow inside R7 in FIG. 2, is preferably selected. The length of shorting radius R may be any length that is related to a physical property of the circuit and is calculated to reduce the number of nodes to be tested. Preferably, it refers to a maximum linear distance between two device pins over which a short may be likely.

In this example we focus on the distance between device pins only, rather than the distance between two nodes over their whole length, because it is assumed that circuit board 200 is soldered by state-of-the-art soldering techniques in which all of the circuit except the device pins is masked, and thus solder only can stick to the device pins. Preferably, the length R represents the maximum expected span of solder blobs or bridges on circuit board 200. Typically, R will be in the range of 1 to 5 millimeters depending on the pitch of the device pins on circuit board 200.

It should be understood that R is a user-definable length, which is set consistent with the user's experience and/or expectations regarding the length a short is likely to cover. The particular length chosen will depend on many factors, such as the soldering technique used to solder the board, the solder temperature, the length of time the board 100 was exposed to the solder, the required degree of certainty that shorts will be detected, etc.

Conveniently, there is only one radius "R" defined for a circuit board and so all radii R1–R7 in FIG. 2 would have the same size. Alternatively, multiple radii may be defined for different parts of circuit board 200. Also, it should be understood that the selection of a radius R serves to define non-boundary-scan nodes that are adjacent to particular BS nodes, and that other means of defining adjacency are possible. For purposes of the present invention, adjacency means all nodes that are so physically close to each other so as to have a significant probability of an electrical short existing between them in light of the manufacturing processes (and known defects of those processes) used to construct the circuit board.

Although R is defined in terms of a length or distance in the preferred embodiment, it might also be defined by some other criteria such as pin spacing or pin counts. For example, R might be defined as one pin such that it encompasses only device pins which are immediately adjacent to the selected boundary-scan pin. Alternatively, R might be defined as two pins (for example, if large solder blobs were known to exist in the manufacturing process), in which case the radius R would include the two pins adjacent to the selected boundary-scan pin. These other methods of determining adjacency are essentially shorthand methods which define the physical distances used in the preferred embodiment in terms of device parameters. Hence, it is contemplated that these methods of determining adjacency are within the scope of the present invention.

Given the cartesian coordinate (X,Y) locations of two device pins, i.e. (a, b) and (c,d), the distance between them is given by the square root of $((a-c)^2+(b-d)^2)$. If this value is equal to or smaller than the shorting radius R, then these device pins are candidates for shorting and must be tested. That is, the algorithm that defines the set T is those accessible non-boundary-scan nodes for which $((a-c)^2+(b-d)^2)^{1/2} \leq R$ where (a, b) is the (X,Y) location of the device pins of the boundary-scan node selected and (c,d,) is the (X,Y) location of the accessible non-boundary-scan node device pins.

For example, one could simply define that for any given integrated circuit, pin 2 (as defined by the IC manufacturer) is adjacent to pins 1 and 3, and pin 3 is adjacent to pins 2 and 4, and likewise for all the pins on the circuit board. This kind of adjacency definition is called "numerical adjacency" and does not require the user to input X,Y coordinates of the device pins or nodes on the circuit board, or to select a radius "R". Numerical adjacency is a much less sophisticated concept, and will usually be less desirable than the preferred method of defining a radius "R" set out above.

For FIG. 2, the first set, $T_1$, includes non-boundary-scan nodes 226 and 227 which are within radius R1 of pin 236. There are no non-boundary-scan pins which fall within radius R2 surrounding device in 237. This process of determining sets $T_x$ is repeated until all boundary-scan nodes are chosen. The table below summarizes the grouping of sets $T_1$ through $T_3$ for the boundary-scan nodes shown in FIG. 2.

| BOUNDARY SCAN NODE | PINS | RADII | SET OF NON-BOUNDARY-SCAN PINS |
| --- | --- | --- | --- |
| 221 | 236, 237 | R1, R2 | $T_1$ = 226, 227 |
| 222 | 238, 239, 241 | R3, R4, R5 | $T_2$ = 228, 229, 231 |
| 223 | 242, 243 | R6, R7 | $T_3$ = 231, 232, 233, 234 |

While in reference to the exemplary circuit 200 the set T can be determined by observation, in the preferred embodiment the (X,Y) coordinates of the accessible device pins are input into remote computer 14 by means of data input 16 (shown in FIG. 1), which may be a LAN, telephone line, CDROM, disk or tape drive, keyboard or other data input mechanism. Computer 14 is programmed with the above-discussed algorithm, an R is selected, and the computer 14 calculates the set T for each boundary-scan node, and upon directions from the keyboard in data input 16, provides the set information to tester 12.

In the preferred embodiment of the invention conventional unpowered shorts testing is performed prior to the novel testing using the set T according to the invention. In the unpowered shorts testing tester 12, under control of a program input by remote computer 14, applies a low voltage signal on one nail, via one of drivers 37 and relays 34, and looks for that voltage on the other nails, via relays 34 and receivers 38. This test can only be performed on nodes to which tester 12 has physical access, i.e. the nodes that have nails attached. Since unpowered shorts testing depends on nail access to nodes, it is becoming less and less possible with advances in physical integration of circuits. If a short is found in the unpowered shorts testing, the rest of the tests are preferably not performed until the board has been repaired and unpowered shorts testing does not show any faults.

The test according to the invention provides methods that are optimal for testing for shorts between a boundary-scan node and a conventional node. The technique of the invention is essentially a hybrid of boundary-scan and in-circuit shorts testing with the power turned on. Since, preferably, the board 200 has passed the conventional unpowered shorts testing, we can assume that shorts do not exist between accessible non-boundary-scan nodes. The powered shorts test according to the invention is carried out by tester 12 under the control of a program generated by computer 14.

As in conventional boundary-scan testing, one of drivers 37 and receivers 38 (shown in FIG. 1) is assigned to each of the external boundary-scan nodes and connected to the assigned node via one of relays 34. In addition, a test time limit for each of the non-boundary-scan nodes to be tested may be determined. This test time limit is the time that a short between that non-boundary-scan node and a boundary-scan node within the radius R can be tolerated. An overall time limit for the circuit as a whole may also be determined.

This time limit would take into account possible shorts in inaccessible non-boundary-scan nodes. These time limits can be determined using the method and apparatus of U.S. Pat. No. 4,588,945 which is incorporated herein by reference. The boundary-scan nodes are then preferably ordered for testing in the order corresponding to the order of the length of time limits associated with the non-boundary-scan nodes in the sets T, with the boundary-scan node for which the set T includes the node or nodes with the shortest time limit tested first.

The Boundary-scan Kernel

Figure 3:
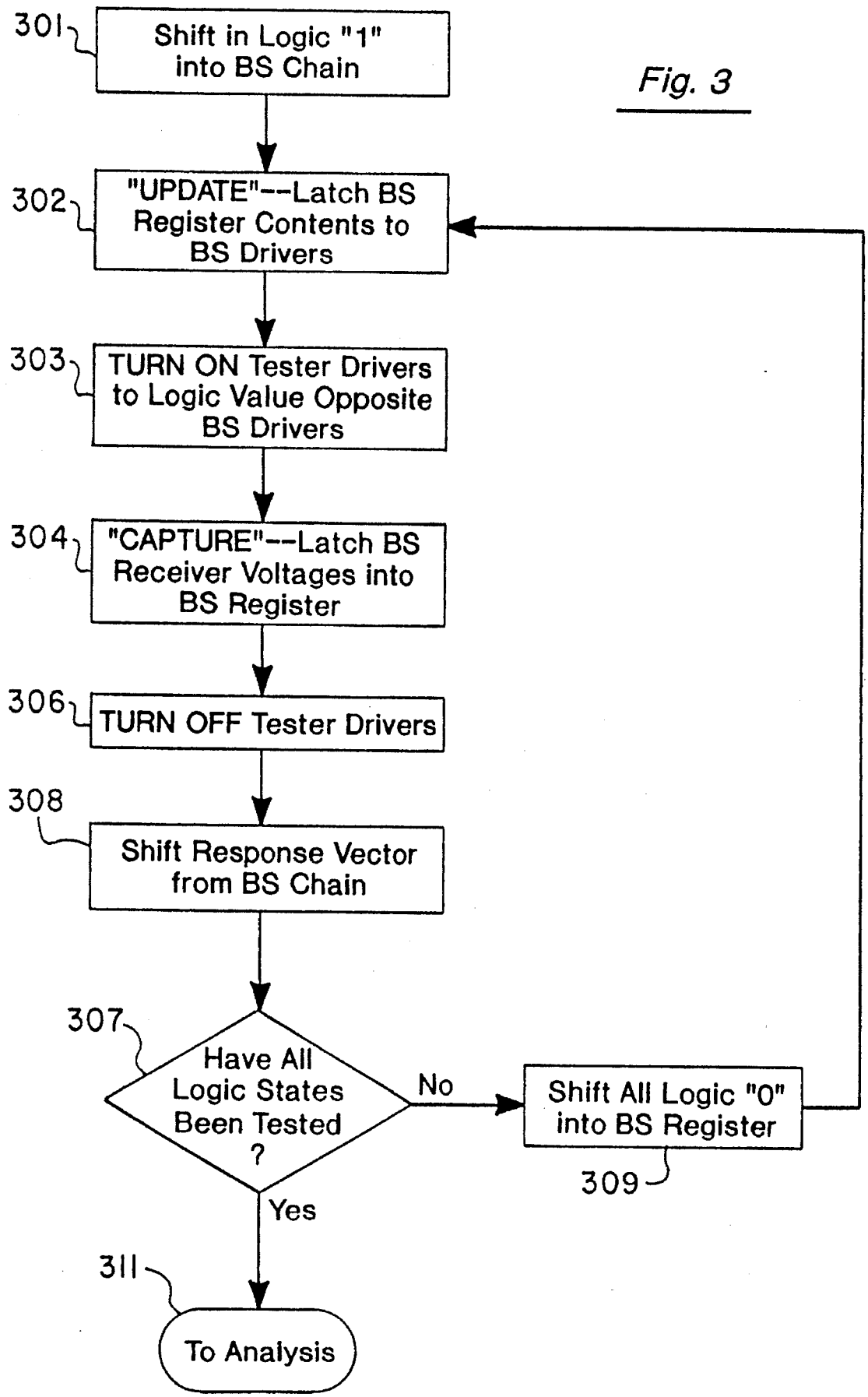
FIG. 3 shows a flow chart of a boundary-scan kernel of a test method in accordance with the present invention.
Figure 5:
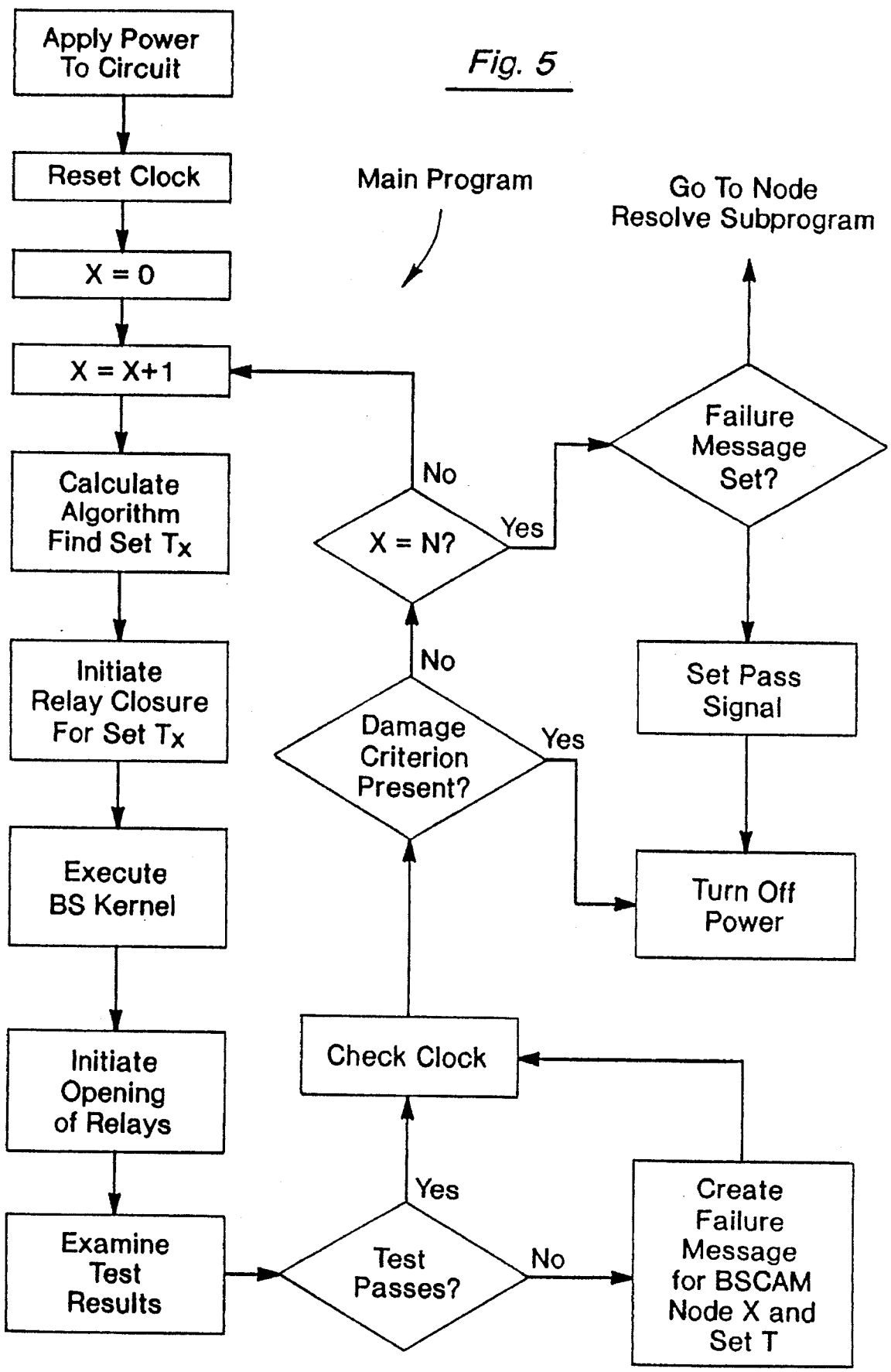
FIG. 5 shows a flow chart of a first embodiment method for testing circuit boards with the apparatus of FIG. 1.
Figure 6:
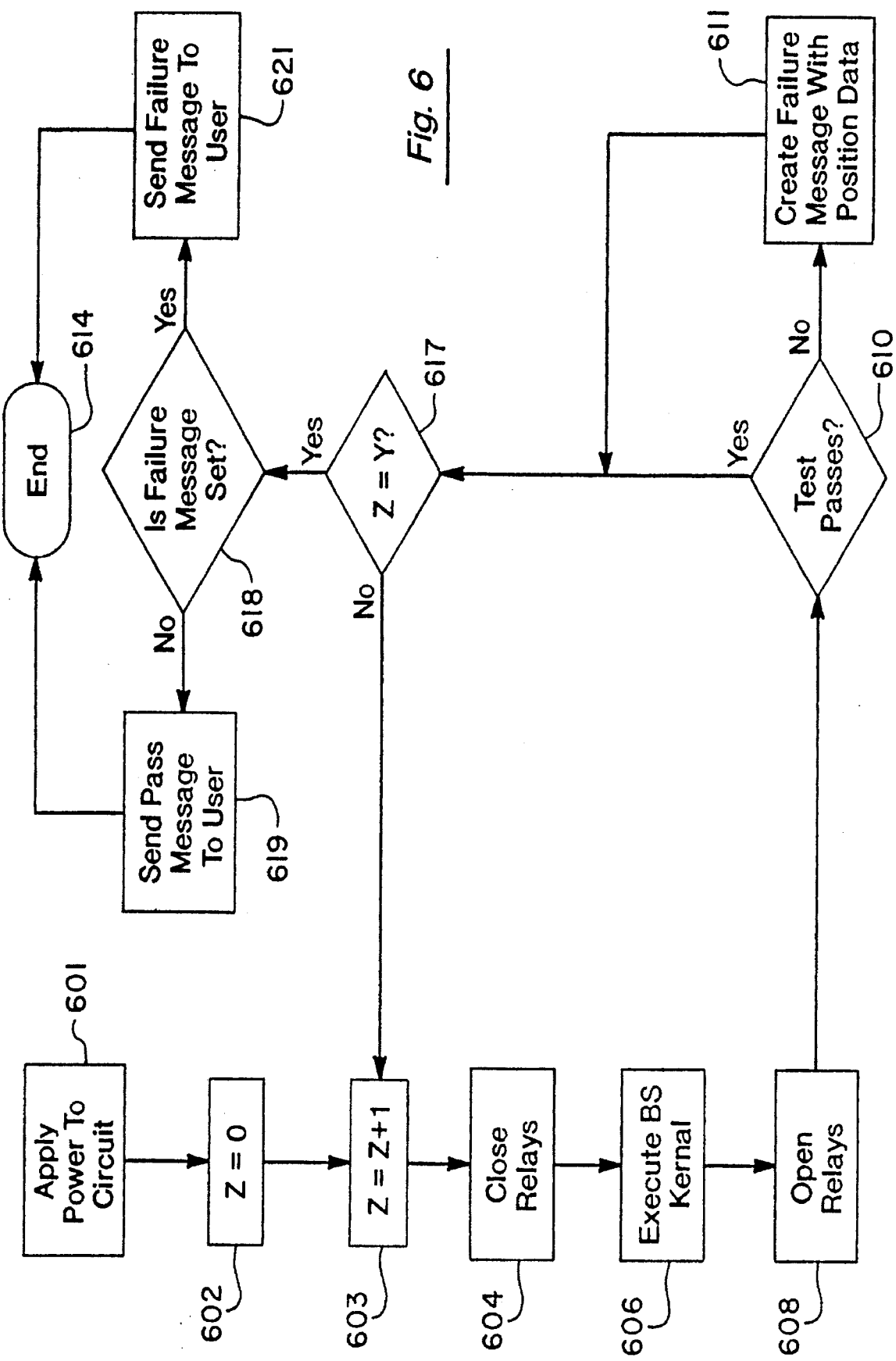
FIG. 6 shows a flow chart of second embodiment method for testing circuit boards with the apparatus of FIG. 1.

An important subroutine of the test program in accordance with the present invention is the "boundary-scan kernel" illustrated in the flow chart of FIG. 3. This subroutine or kernel is essentially a modified version the defined boundary-scan test called "EXTEST" and is placed into the flows of the methods of the present invention as shown in FIG. 5 and FIG. 6. As will be seen, the modifications of the conventional EXTEST involve coordinating the EXTEST with the activation of external tester drivers 37 (shown in FIG. 1) to provide high-speed testing without risking damage to circuit board 200 (shown in FIG. 2).

At step 301 in FIG. 3, the shift-registers of the boundary-scan chain are filled with voltages corresponding to a first logic state. This first logic state is logic "1" in FIG. 3 corresponding to approximately a +5 volt signal for CMOS technology. Although the registers contain the logic "1", the boundary-scan drivers still have an indeterminable output during step 301. The boundary-scan chain then performs an UPDATE function in step 302 to latch the shift register contents onto the boundary-scan driver circuits, such as cells 213 in FIG. 2. At step 302, the boundary-scan nodes are driven to the voltage corresponding to logic "1".

At step 303, the tester drivers, which are attached to predetermined non-boundary-scan nodes, are briefly turned on and driven to a different voltage than that applied to the boundary-scan nodes. Preferably, this voltage corresponds to an opposite logic state as that applied to the BS node. The boundary-scan circuitry is caused to "CAPTURE" the response vector during step 304. CAPTURE is a defined boundary-scan function in which each of the receiver circuits, such as receivers 212 in FIG. 2, latch a voltage that is on the boundary-scan device pin into a register in the boundary-scan receiver circuit 212.

Preferably, the tester drivers applied to the non-boundary-scan nodes use in-circuit overdrive techniques which means that the drivers can drive sufficient current to overcome any device which may be attempting to place another voltage on a node. Hence, while the tester drivers are on during steps 303–306 the circuit is at greatest risk of damage caused by the overdrive current. As soon as possible after the CAPTURE is completed, the tester drivers are turned off in step 306.

A response vector, which includes all of the response voltages which were captured by the boundary scan receiver circuits, is shifted out of the boundary scan chain in step 308 via the TDO terminal 218 shown in FIG. 2. In step 307, the boundary-scan kernel determines if all logic states (i.e., logic "1" and logic "0" for binary logic) have been tested. If not, the method passes to step 309 in which the second logic state (i.e, logic "0" in FIG. 3) is shifted into the boundary-scan chain via the TDI terminal 217 in FIG. 2. Preferably, step 309 is performed at the same time as the response vector is shifted out (step 308) of the boundary-scan chain and the program returns to step 302. A voltage corresponding to a logic state opposite that applied to the boundary-scan nodes is then applied to the selected non-boundary-scan nodes by tester drivers 37. If all logic states have been tested, the response vector is shifted out in step 308 for analysis in step 311.

An important feature of the present invention is that both logic levels are applied to the boundary-scan nodes and the non-boundary-scan nodes. The non-boundary-scan nodes are always driven to the opposite logic level as that applied to the boundary-scan nodes. Preferably, the analysis step 311 does not identify a node as a failure unless the node fails at both logic levels. This is because a node might fail at one logic level if an incomplete solder connection, or open circuit, exists on that node. This is because an open circuit leaves the boundary-scan receiver at an indeterminate state (either logic 1 or logic 0). In such a case, testing at the other logic level will result in a passing test if an open exists. Only if analysis sees a failed node with both the logic 1 and the logic 0 testing, does a short circuit exist.

Non-Boundary-Scan Node Grouping and Set Selection

Figure 4:
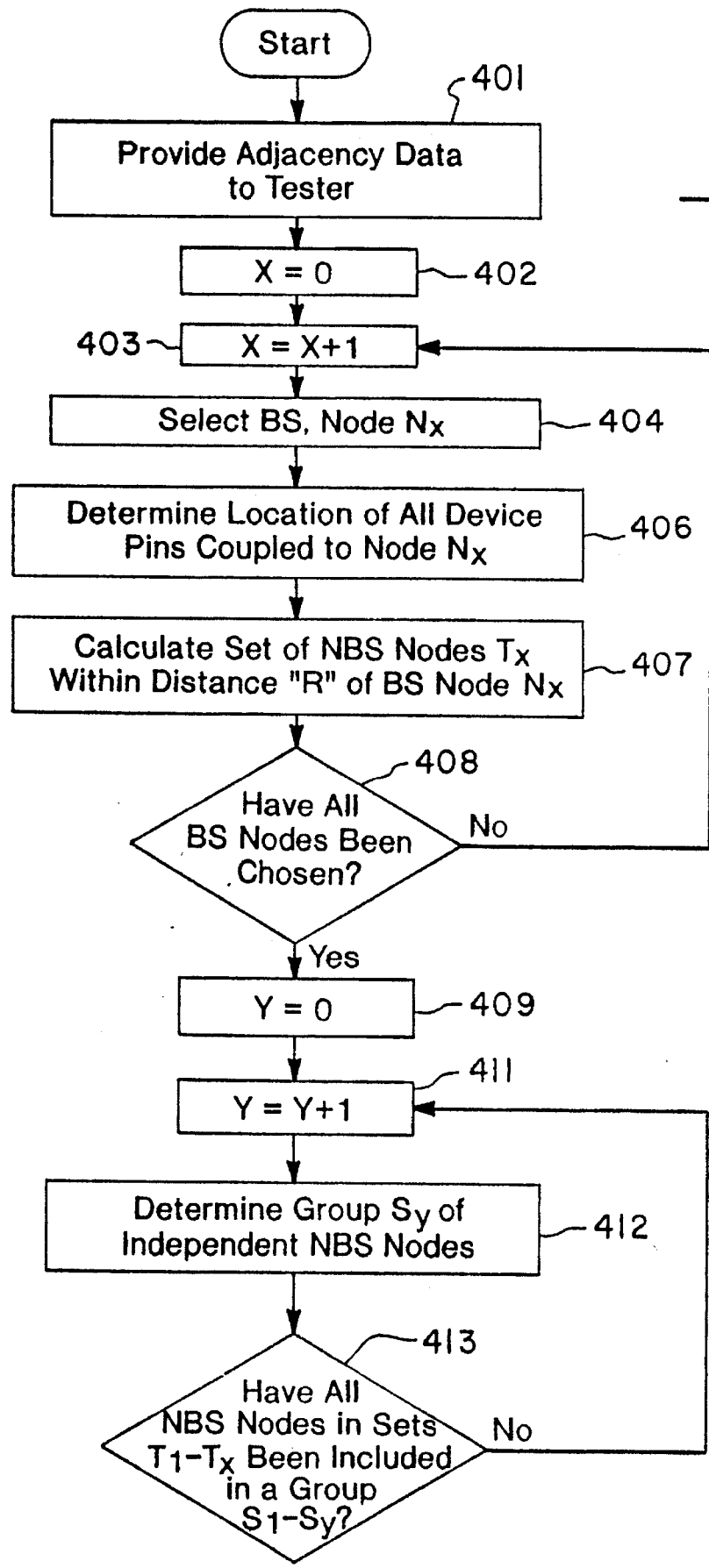
FIG. 4 shows a flow chart subroutine for grouping nodes before testing.

FIG. 4 illustrates a subroutine for grouping non-boundary-scan nodes into sets that are associated with a boundary-scan node. The subroutine in FIG. 4 also includes steps for determining non-boundary-scan nodes in the sets T which are "independent" which will result in forming groups S of independent non-boundary-scan nodes. The preferred test method of the present invention, precise location of any faults is returned to the user without need for the additional testing required by a node resolve subroutine.

Steps 401 through 408 in FIG. 4 are used to determine the sets T of non-boundary-scan nodes which are associated with a boundary-scan node, as described above in reference to Method 1. Essentially, the process is started at 401 when information is supplied to the tester about relative position of the device pins of all of the boundary-scan and non-boundary-scan devices on the circuit board to be tested. Conveniently, this information is in the form of X, Y coordinates of a cartesian coordinate system, although other position methods, such as numerical adjacency discussed above, may be used. For purposes of discussion this data is called "adjacency data."

The X counter, which represents the number of boundary-scan nodes in the circuit board, is initialized at step 402 and incremented at step 403. A boundary-scan node $N_x$ is selected, which could be any boundary-scan node on the circuit board, at step 404. Using the algorithm set out hereinbefore, a set $T_x$ of non-boundary-scan nodes that are within a predetermined distance R of the selected boundary-scan node $N_x$ are determined in step 406. Thus, there will be a set T for every boundary-scan node in the circuit board, although some of the sets T might be empty. This set-building process is repeated until all boundary-scan nodes on the circuit board have been selected.

Steps 409 through 413 are performed to identify or group the members of the sets T into groups S of "independent" non-boundary-scan nodes. In terms of adjacency used above in regard to the sets T, a group of independent non-boundary-scan nodes is a group in which each BS node on the circuit board is adjacent or within the predetermined distance R of only one non-boundary-scan node in the independent group. Because of this relationship, all of the non-boundary-scan nodes in each group can be tested at the same time or in parallel, without creating any ambiguity in the test results. In this manner, the reduced test time provided by parallel testing is achieved without sacrificing the ability to precisely identify the location of any faults on the circuit board.

Sets of non-boundary-scan nodes are independent if all non-boundary-scan nodes in each of the sets can be tested simultaneously without creating an ambiguity in the test result. In other words, if a particular receiver circuit 212 (shown in FIG. 2) is physically situated with respect to several non-boundary-scan nodes such that it can be stimulated if a short circuit exists to any of those non-boundary scan nodes, then those non-boundary-scan nodes are not independent.

Using circuit board 200 in FIG. 2, set $T_2$=228, 229, 231 and set $T_3$=231, 232, 233, 234. If a short existed between pins 231 and 242 of device 202, receiver pin 243 would be stimulated. Likewise, if a short existed between pins 232 and 242, receiver pin 243 would be stimulated. Hence, pin 231 is not independent from pin 232 and they cannot be tested in parallel. In contrast, non-boundary-scan node 228, which is also a part of set $T_2$ is unlikely to stimulate receiver circuit 212 coupled to pin 243, and so pin 228 is independent from pin 232. This process for determining the dependency of non-boundary-scan nodes in sets $T_1-T_x$ is repeated either before or during testing until all non-boundary-scan nodes in sets $T_1-T_x$ are tested.

It should be understood that not all of the sets $T_1$ through $T_x$ will have independent non-boundary-scan nodes in some other set T. In other words, some non-boundary-scan nodes cannot be tested in parallel with other non-boundary-scan nodes without confounding the test data. In these cases, the group S will contain only one non-boundary-scan nodes. Once all the non-boundary-scan nodes in sets $T_1-T_x$ have been included in a group $S_1$ through $S_y$, testing in accordance with the present invention can begin.

Method 1

A flow chart of a first embodiment program is shown in FIG. 5. In this flow chart X designates the particular boundary-scan node and T designates a corresponding set of non-boundary-scan nodes associated with the boundary-scan node X. N is equal to the total number of boundary-scan nodes to be tested. To initiate the test, power is applied to the circuit to be tested. At essentially the same time, the clock 56 is reset and begins counting the time since the initiation of power. X is set to 0 and then incremented by one to set it to 1. Then a set $T_1$ of non-boundary-scan nodes is calculated by a processor within controller/sequencer 54 or by remote computer 14 (shown in FIG. 1), using the algorithm discussed above and (X,Y) or position data previously input, while the circuit is coming up to full power.

As suggested above, this calculation could also be performed before the test is done in connection with the ordering of the boundary-scan nodes. In that case, this step would comprise the transferring of data regarding the nodes comprising the sets T. In method one, the groups S of independent non-boundary-scan nodes are not used, so this data need not be transferred. One of drivers 37 is assigned to each node in the set $T_1$ and connected to that node by closing of one of relays 34. While the relays 34 are traveling, the boundary-scan kernel is set up by tester 12. The logic 0 value is chosen because it is most likely to be least damaging to most circuits, such as TTL circuits. If some other value is determined to be less likely to be damaging, then that value would be selected.

Whatever logic value is chosen, it is applied using standard in-circuit overdrive techniques, so that no matter what the non-boundary-scan device, such as 204, is attempting to do with the attached non-boundary-scan node, such as 228, a value can be guaranteed. The boundary-scan test is then run. Preferably the boundary-scan EXTEST function is the boundary-scan test run. The boundary-scan EXTEST function puts every boundary-scan driver at logic 1, the responses of the corresponding boundary-scan receivers on the corresponding nodes are captured, then the boundary-scan drivers are put at logic 0 while changing the non-boundary-scan tester drivers to a logic "1", and the responses at the receivers captured. This test is described above as the boundary-scan kernel in reference to FIG. 3.

For example, referring to FIG. 2, the boundary-scan driver on pin 242 of boundary-scan device 202 connected to node 223 is set to logic 1 which must be captured by the boundary-scan receiver on pin 243 of device 203 while the associated non-boundary-scan nodes coupled to device pins 231, 232, 233 and 234 (i.e. the non-boundary-scan nodes in group T1) are driven to a logic 0. Then the driver of device 202 is set to logic 0, the tester drivers coupled to device pins 231, 232, 233 and 234 are driven to a logic 1 and the logic 0 must be captured by the receiver pin 243 of device 203.

Immediately after the boundary-scan kernel is run, the opening of the relays attached to the non-boundary-scan nodes is initiated. While the relays are opening, the test results are analyzed. The results are read out by a processor within controller/sequencer 54, or by computer 14 (shown in FIG. 1). The status of the boundary-scan nodes is examined only at those points relevant to the test: that is, if boundary-scan node 223 were connected to other boundary-scan devices at device pins where there were no non-boundary-scan device pins within the radius R, then the value that the boundary-scan receivers at these device pins captured would be irrelevant to testing and not be examined. This can shorten the test considerably if there are a preponderance of boundary-scan devices.

During the boundary-scan kernel, with the drivers for the set $T_1$ set to logic 0, if the logic 1 of the boundary-scan driver is not captured, a problem exists with either the corresponding boundary-scan driver or its associated interconnect. If a logic 1 of the boundary-scan drivers is not captured, then it is possible that a short condition exists between one or more of the nodes $T_1$ and the boundary-scan node. If a logic 0 of the boundary-scan drivers is not captured during the second pass when the node has also failed during the first pass, then it is known that a short condition exists between one or more of the nodes $T_1$ and the boundary-scan node.

If the set $T_1$ passes, the clock 56 is checked. If the set $T_1$ does not pass the test, that is if a logic 1 is not captured during the boundary-scan kernel (assuming the non-boundary-scan drivers are set at logic 0), then a failure message is created identifying the boundary-scan node tested and the set $T_1$, before the clock 56 is checked. Upon checking clock 56, if a damage criterion is present, that is, if one of the time limits associated with any of the boundary-scan nodes that have not yet been tested has expired, or if any one of the time limits associated with any one of the boundary-scan nodes that has been tested and has failed the test has expired, or if the overall circuit time limit has expired, then the power is turned off. Note that the expiration of a time limit while a loop is being executed is generally not a problem. Generally, the time limits are relatively large as compared to the time it takes to execute a loop, and the uncertainty or slack in the determination of the time limits is generally much larger than the loop execution time.

If no damage criterion is present, then the value of X is checked to see if all the boundary-scan nodes have been tested, and if not, X is incremented by one and the next boundary-scan node is tested. If all boundary-scan nodes have been tested, then the failure message record is examined and if no failure message was created then a pass signal is set indicating that the board has passed the test, and the test is terminated.

If a failure message is set in the main program, and the power has not been turned off due to the expiration of a time limit, then a Node Resolve Subprogram is entered in the first embodiment. An example of a node resolve subprogram is described in detail in copending application Ser. No. 08/088,279, now U.S. Pat. No. 5,387,862. After the above tests have been completed, a standard boundary-scan interconnect test is run that verifies the integrity of just the boundary-scan nodes alone.

In the preferred embodiments, tester 12 is a Hewlett Packard HP3070 tester and computer 14 is a Hewlett Packard HP9000 computer, although other suitable testers and computers could be used. The HP9000 computer is equipped with data inputs 16 and data outputs 18 such as a keyboard, disk and tape drives and a display.

Method 2

FIG. 6 illustrates a flow chart for a preferred test method that identifies precise position of any faulty nodes without requiring a node resolve subroutine. At step 601, power is applied to the circuit board, and a Z counter, which counts the number of test cycles, is initialized to zero. In each test cycle, all of the non-boundary-scan nodes in one group $S_1$ through $S_y$ are tested. A number of test cycles, Y in this case, are performed until all of the sets $S_1$ through $S_y$ are tested. At step 603, the Z counter is incremented by one, and in step 604 relays 34 (shown in FIG. 1) of the tester drivers are closed in preparation for applying power to the non-boundary-scan nodes. The boundary-scan kernel (shown in FIG. 3) is executed in step 606.

The test results can be analyzed immediately, or stored for later analysis depending on the needs of the user. The test results are analyzed in step 510 in the preferred embodiment, which occurs at the same time as the boundary-scan chain is setup for the next test cycle, which is time 704 in FIG. 7. If a failure occurred during the test, a failure message is created in step 611 that contains position information regarding the location of the failure.

It will be recalled that the coordinate or position data of each device pin and node was given to the tester at the beginning of the test cycle in step 401 (shown in FIG. 4). Because the method of the present invention creates sets and groups of independent non-boundary-scan nodes, it does not confound the data in the response vector even though the non-boundary-scan nodes are tested in parallel. Thus, the tester can provide a failure message that returns the coordinate location information for any node or pin that happens to fail.

Before step 617 the test clock is preferably checked to determine if damage criteria are present, and the power turned off if necessary, as described in reference to FIG. 5. These steps are optional in the practice of the present invention and for ease of understanding, these steps are not shown in FIG. 6.

When no damage criteria are present, the program to step 617 to check the Z counter to determine if all groups $S_1$ through $S_y$ have been tested. If not, the Z counter is incremented and the testing continues by repeating steps 603 through 616. When all the groups have been tested, the program passes to step 618 which checks to see if any failure occur (i.e., any failure message created during step 611). If a failure message occurred, it is delivered to the user in step 621. If no failure message occurred, a pass message is sent to the user in step 619. In any case, once the user is informed of the circuit status, testing is terminated in step 614.

Timing

Test time, or the elapsed time required to test a circuit board, is extremely important. Likewise, it is very important that the tester not damage the circuit board during testing, so that errors or faults which are detected can be repaired. The present invention addresses both of these concerns by careful coordination of the boundary-scan and non-boundary-scan tester drivers during the test method in accordance with the present invention. In particular, the present method allows the tester drivers which apply voltages to the non-boundary-scan nodes to be unusually brief while at the same time capturing accurate data.

Figure 7:
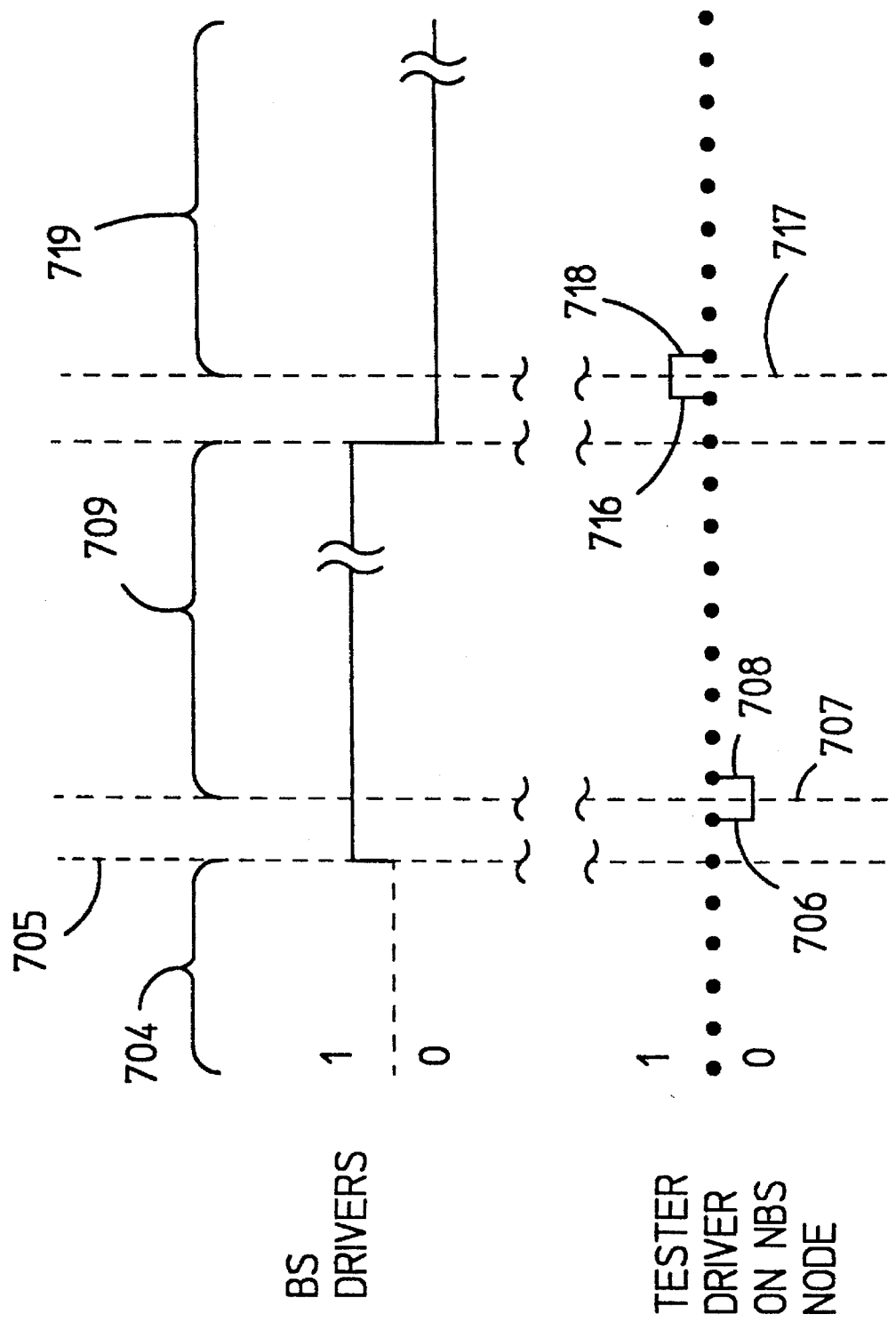
FIG. 7 shows a timing diagram of the testing procedure shown in FIG. 6.

FIG. 7 shows a timing diagram which illustrates the relative timing and duration of the events described in reference to FIG. 3. The upper waveform represents the output of the boundary-scan drivers 213 in FIG. 2. The dashed line indicates that the boundary-scan drivers 213 are in an indeterminant state. The lower waveform represents the output of the tester drivers 37 (shown in FIG. 1) to the non-boundary-scan nodes. The dotted line indicates the tester drivers are in a high impedance or tri-state.

Setup time period 704 represents the duration of step 301 in which the boundary-scan chain is filled with voltages corresponding to logic "1". At time 705, the update step 302 is performed, causing the boundary-scan drivers to move from a high impedance state during time period 704, to a logic 1 voltage at time 705. At time 706, the tester drivers are turned on, causing the non-boundary-scan nodes to which they are attached to move to a voltage corresponding to a logic "0".

At time 707, the response vector is captured as shown in step 304 in FIG. 3, and at time 708 the tester drivers are turned off as shown in step 306 of FIG. 3. Preferably, the total elapsed time between times 706 and 708 in FIG. 7 is small, for example less than 200 nanoseconds. During time period 709, the response vector is shifted out, and the second logic state (i.e., logic "0" in FIG. 3 and FIG. 7) is shifted into the boundary-scan register, corresponding to steps 308 and 309 in FIG. 3.

Once the second logic states is loaded into the boundary-scan register, the program returns to the update step 302 shown in FIG. 3 and the non-boundary-scan node tester drivers are set to the logic value opposite that of the boundary-scan nodes (i.e. logic "1" in FIG. 7) at time 716. While the tester drivers are on, the capture function is performed at time 717, and the tester drivers are immediately turned off at time 718. Again, the elapsed time between time 716 and 718 is very brief, preferably less than 200 nanoseconds. During time 719 the response vector captured in the receiver circuits is shifted out. At this point, testing for the selected non-boundary-scan nodes is complete, another group S of independent non-boundary-scan nodes is selected, and testing continues.

3. Conclusion

A feature of the invention is that the use of the shorting radius allows a great reduction in the number of nodes that must be tested. As mentioned above, there may be hundreds or thousands of nodes and nails in a typical circuit to be tested. A great majority of these nodes and nails will not be able to short to a given target node because of the lack of physical proximity. The use of the position data in conjunction with the testing method rules out shorts that are highly improbable in actual occurrence. It allows the software to pick a small subset of the nails to consider against each target boundary-scan node. The smallness of this subset greatly reduces the number of digital resources that must be made available and must be controlled in parallel, the amount of diagnostic information that must be analyzed and printed, and the time required to run a definitive test. Thus the invention greatly reduces the cost of testing a circuit as compared to prior art testing apparatus and methods.

Test time is further reduced in accordance with the present invention by determining which non-boundary-scan nodes are independent, and testing independent nodes in parallel. This provides efficient use of tester facilities which usually can apply test voltages to many nodes at one time.

Another feature of the present invention that results in lower test time is that each non-boundary scan node is only tested at a logic 0 and logic 1. In other words, only two voltages need be applied to each node, yet precise location of short circuits is determined. This greatly reduces test time over prior art methods which require up to ten test voltages applied to each non-boundary-scan node in order to determine which node has failed on a board.

Another feature of the invention is that shorts are found as early as possible with the risk of associated damage minimized. This results from the series of tests performed, i.e. the unpowered shorts, the test of the present invention, and the boundary-scan interconnect test, and also from the ordering of the nodes to be tested within the test and the use of time limits to temporarily shut down the power.

A further feature of the invention is the elimination of diagnostic confusion that resulted from prior art boundary-scan testing of circuits having both boundary-scan and non-boundary-scan components. In the prior art testing, shorts that were present would cause interactions between boundary-scan components and uncontrolled non-boundary-scan circuit components, which interactions could not be predicted, repeated, or analyzed. In the test according to the invention, such uncertainty and confusion is eliminated by isolating the boundary-scan nodes, reducing the non-boundary-scan nodes to a manageable number which we know are not shorted to each other, and forcing the non-boundary-scan notes to guaranteed states.

Another feature of the invention is that it can be implemented using testers and computers that are generally available in test facilities. Further, the techniques and programming required are relatively easily understood by testing personnel. Sophisticated mathematics is not required.

There has been described novel apparatus and methods for boundary-scan testing of circuits which provides accurate, definitive, and fast testing of complex circuits and which has many other advantages. It should be understood that the particular embodiments shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to use the (X,Y) data to simplify the testing of circuits, other means which reduces the sets of nodes to be tested by using (X,Y) information may be devised. Or other testers and computers may be used, or other electrical components may be substituted. Other features may be added, or one or the other of the optional features may be deleted. Consequently, the invention is to be construed as embracing each and every novel feature and novel combination of features present in and/or possessed by the described.

We claim:

1. A method of testing a circuit board having
   (i) a plurality of non-boundary-scan (NBS) devices, each of the NBS devices having a number of device pins for electrically coupling to the circuit board;
   (ii) a plurality of boundary-scan (BS) devices, each BS device having a number device pins for electrically coupling to the circuit board, a number of receiver circuits coupled to at least some of the device pins, and a number of driver circuits coupled to at least some of the device pins, wherein the receiver and driver circuits are provided on the plurality of BS devices, wherein each of the receiver circuits and driver circuits are coupled to provide a serial data stream to a data processor;
   (iii) a number of BS nodes wherein each BS node is coupled to both a receiver circuit and a driver circuit, and
   (iv) a number of NBS nodes that are nodes that are not BS nodes, the method comprising the steps of:
      providing position data for each of the device pins of the BS and NBS devices on the circuit board to the tester;
      grouping the NBS nodes into sets of nodes, each set of nodes comprising all of the NBS nodes that are within a predetermined distance of one of the BS nodes;
      applying a first voltage to the circuit using the BS driver circuits;
      applying a second voltage to at least one NBS node;
      causing the receiver circuits to capture voltages on the device pins that the receiver circuits are coupled to;
      analyzing the captured voltages using the data processor to determine faulty pins and nodes; and
      generating a message including returning the position data for device pins and nodes that are determined to be faulty during the analyzing step.

2. The method of testing of claim 1 wherein the step of providing position data comprises providing two cartesian coordinates for each of the device pins on the circuit board.

3. The method of testing of claim 1 wherein the step of providing position data comprises providing numerical adjacency data.

4. The method of testing of claim 1 wherein the predetermined distance is in the range of one to five millimeters.

5. The method of testing of claim 1 wherein at least some of the plurality of non-boundary-scan devices are integrated circuits having analog inputs and outputs.

6. The method of testing of claim 1 wherein at least some of the plurality of non-boundary-scan devices are discrete electronic devices.

7. The method of testing of claim 1 wherein the step of applying a second voltage to at least one NBS node is completed in less than 200 nanoseconds.

8. The method of testing of claim 7 wherein the step of applying a second voltage to at least one NBS node uses in-circuit overdrive techniques.

9. A method of testing a circuit board having (i) a number of boundary-scan (BS) nodes, and
   (ii) a number of non-boundary-scan (NBS) nodes that are nodes that are not BS nodes, the method comprising the steps of:
      providing position data for each of the number of BS and NBS nodes on the circuit board to the tester;
      providing a predetermined distance (R) to the tester, wherein R is in the range of one to five millimeters;
      determining an group of independent NBS nodes such that each BS node on the circuit board is within the predetermined distance of only one NBS node in the independent group;
      applying a predetermined voltage corresponding to a first logic state to the BS nodes;
      applying a predetermined voltage corresponding to a second logic state to all of the NBS nodes of the group of independent NBS nodes;
      capturing voltages on the BS nodes while the predetermined voltage corresponding to a second logic state is applied; and
      analyzing the captured voltages to detect electrical shorts between any of the NBS nodes in the independent group and a BS node.

10. A method of testing a circuit board having at least one boundary-scan node and at least one non-boundary-scan node, the method comprising the steps of:
    applying a first test voltage to the at least one boundary-scan node;
    applying a second test voltage to the at least one non-boundary-scan node;
    storing a first resulting voltage on the at least one boundary-scan node;

applying the second test voltage to the at least one boundary-scan node;

applying the first test voltage to the at least one non-boundary-scan node;

storing a second resulting voltage on the at least one boundary-scan node; and generating a failure message when both i) the first resulting voltage corresponds to the second test voltage and ii) the second resulting voltage corresponds to the first test voltage.

* * * * *